(12) United States Patent
Xiao et al.

(10) Patent No.: US 11,394,009 B2
(45) Date of Patent: Jul. 19, 2022

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yunsheng Xiao, Beijing (CN); Haigang Qing, Beijing (CN); Xiangdan Dong, Beijing (CN); Tingliang Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 141 days.

(21) Appl. No.: 16/768,953

(22) PCT Filed: Jun. 14, 2019

(86) PCT No.: PCT/CN2019/091371
§ 371 (c)(1),
(2) Date: Jun. 2, 2020

(87) PCT Pub. No.: WO2020/248257
PCT Pub. Date: Dec. 17, 2020

(65) Prior Publication Data
US 2021/0408471 A1 Dec. 30, 2021

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01)

(58) Field of Classification Search
CPC .............. H01L 27/3246; H01L 51/5253–5256
See application file for complete search history.

(56) References Cited

U.S. PATENT DOCUMENTS

| 10,439,163 B2* | 10/2019 | Su | H01L 51/5246 |
| 2017/0331058 A1* | 11/2017 | Seo | H01L 51/5293 |
| 2019/0181362 A1* | 6/2019 | Tian | B32B 3/266 |
| 2020/0251683 A1* | 8/2020 | Sun | H01L 51/0096 |
| 2021/0257416 A1* | 8/2021 | Sun | H01L 27/3246 |

* cited by examiner

*Primary Examiner* — Shaun M Campbell
(74) *Attorney, Agent, or Firm* — Fay Sharpe LLP

(57) ABSTRACT

Provided is a display substrate having a polygonal encapsulation region with a plurality of edges and a periphery region surrounding the encapsulation region. The display substrate includes a base substrate, and a partition structure within the periphery region on a side of the base substrate. The partition structure includes a plurality of isolation dams, arranged at intervals along a direction away from the encapsulation region, outside each edge of the encapsulation region. The plurality of edges include a first edge and a second edge, and a plurality of first isolation dams outside the first edge are not in connection with, and have more dams than, a plurality of second isolation dams outside the second edge.

19 Claims, 9 Drawing Sheets

DISPLAY SUBSTRATE AND DISPLAY DEVICE

CROSS-REFERENCE TO RELATED APPLICATION

The present disclosure is a 371 of PCT Application No. PCT/CN2019/091371, filed on Jun. 14, 2019, and titled "DISPLAY SUBSTRATE AND DISPLAY DEVICE," which is incorporated herein by reference in its entirety.

TECHNICAL FIELD

The present disclosure relates to the field of display technologies, and in particular to a display substrate and a display device.

BACKGROUND

The display substrate may be an active luminescent product or a passive luminescent product in the field of display technologies. An organic light emitting diode (OLED) display substrate is an active luminescent display substrate which may be flexible. In the OLED display substrate, as the light emitting effect of an organic light emitting material would be influenced after the organic light emitting material is in contact with moisture and oxygen, the encapsulation of the OLED display substrate is of great importance.

SUMMARY

The present disclosure provides a display substrate and a display device. The technical solutions are as follows:

In a first aspect, a display substrate is provided. The display substrate having an encapsulation region and a periphery region surrounding the encapsulation region, the encapsulation region in a polygonal shape. The display substrate includes:

a base substrate; and a partition structure, located on a side of the base substrate and within the periphery region, the partition structure including a plurality of isolation dams at a side of a plurality of edges of the encapsulation region, wherein the plurality of isolation dams at a side of a same edge of the encapsulation region are arranged at intervals along a direction away from the encapsulation region;

wherein the encapsulation region has a first edge and a second edge, a plurality of first isolation dams at a side of the first edge are not in connection with a plurality of second isolation dams at a side of the second edge, and a number of the second isolation dams is greater than a number of the first isolation dams.

Optionally, the encapsulation region is further has a first corner edge;

the first corner edge is located between the first edge and the second edge, the two ends of the first corner edge are respectively connected with the first edge and the second edge, and a length of the first corner edge is less than both a length of the first edge and a length of the second edge; and a number of first corner isolation dams at a side of the first corner edge is equal to the number of the first isolation dams, the first isolation dams and the first corner isolation dams are in a continuous and integral structure, and the plurality of second isolation dams are not in connection with the plurality of first corner isolation dams.

Optionally, the first corner isolation dams have one of a linear structure and an arch-shaped structure.

Optionally, the first edge is perpendicular to the second edge, the second edge is an edge proximal to a fan-out region of the display substrate, and the encapsulation region further has a third edge, a second corner edge, a fourth edge, a third corner edge and a fourth corner edge;

the third edge is parallel to the first edge;

the second corner edge is located between the second edge and the third edge, and two ends of the second corner edge are respectively connected with the second edge and the third edge;

the fourth edge is parallel to the second edge;

the third corner edge is located between the third edge and the fourth edge, and two ends of the third corner edge are respectively connected with the third edge and the fourth edge; and the fourth corner edge is located between the fourth edge and the first edge, and the two ends of the fourth corner edge are respectively connected with the fourth edge and the first edge.

Optionally, the first corner edge, the second corner edge, the third corner edge and the fourth corner edge are all oblique straight-line edges, the first corner edge is parallel to the third corner edge, and the second corner edge is parallel to the fourth corner edge.

Optionally, orthographic projections of the second isolation dams onto the base substrate do not overlap with the fan-out region, the second isolation dams includes a plurality of first sub-isolation dams and a plurality of second sub-isolation dams, the plurality of first sub-isolation dams are located a one side, proximal to the first edge, of the fan-out region, and the plurality of second sub-isolation dams are located a side, proximal to the third edge, of the fan-out region; and the plurality of first sub-isolation dams and the plurality of second sub-isolation dams are symmetrically arranged with respect to a perpendicular bisector of the second edge.

Optionally, the display substrate further includes a bonding region located on a side, distal from the second edge, of the fan-out region, wherein the bonding region meets the fan-out region, and the orthographic projections of the second isolation dams onto the base substrate do not overlap with the fan-out region or the bonding region.

Optionally, the isolation dams on a side of any edge of the encapsulation region extend in a substantially same direction as the edge.

Optionally, a plurality of endpoints, at an end proximal to the first corner isolation dams, of the plurality of the second isolation dams that are arranged in a straight line parallel to an extension direction of the first corner isolation dams.

Optionally, a plurality of endpoints, at an end distal from the first isolation dams, of the plurality of the first corner isolation dams are arranged in a straight line parallel to an extension direction of the second isolation dams.

Optionally, a plurality of endpoints, at an end distal from the first isolation dams, of the plurality of the first corner isolation dams are arranged in a same straight line, together with a farthest second isolation dam from the encapsulation region in the plurality of second isolation dams.

Optionally, the isolation dams at a side of target edges of the encapsulation region are in a continuous and integral structure, and the target edges include all the other edges, except the second edge, of the encapsulation region.

Optionally, the number of the second isolation dams is 2 to 3 times the number of the first isolation dams.

Optionally, the number of the first isolation dams is 5, and the number of the second isolation dams is 12.

Optionally, the isolation dams have at least one of a stripe structure, a zigzag form structure and an arcuate structure.

Optionally, the isolation dams are prepared from an inorganic material; the partition structure further includes an organic layer covering the isolation dams respectively; and an orthographic projections of the isolation dams onto the base substrate are within an orthographic projection of the corresponding organic layer onto the base substrate.

Optionally, the organic layer is located on a side, distal from the base substrate, of the isolation dams; and orthographic projections of the isolation dams onto the base substrate and orthographic projections of the organic layer onto the base substrate coincide.

Optionally, all the surfaces, except a target surfaces, of each of the isolation dams are coated with the organic layers, the target surface being a surface of the isolation dams adjoining the base substrate.

Optionally, the partition structure satisfies at least one of the following conditions:

the organic layer is arranged in a same layer as an organic film layers in the encapsulation region; and the isolation dams are arranged in a same layers as an inorganic film layers in the encapsulation region.

Optionally, the display substrate has a display region located in the encapsulation region, and in the display region, a thin film transistor, a light emitting device, and an encapsulation layer are sequentially arranged in the display region along a direction away from the base substrate, and the thin film transistor includes a buffer layer, an active layer, a gate insulating layer, a gate pattern, an interlayer dielectric layer, a source-drain pattern, and a flattened layer that are sequentially along a direction away from the base substrate;

the isolation dams are arranged in a same layer as at least one inorganic film layer of the thin film transistor, each the inorganic film layer of the thin film transistor includes the buffer layer, the gate insulating layer and the interlayer dielectric layer; and the organic layer is arranged in a same layer as the flattened layer.

Optionally, the source-drain pattern includes a source, a drain, and a signal trace, the gate pattern includes a gate, the thin film transistor further includes a target insulating layer and a capacitor plate located between the gate and the interlayer dielectric layer, and an orthographic projection of the capacitor plate onto the base substrate overlaps with an orthographic projection of the gate onto the base substrate;

the source and the drain are respectively connected with the active layer through via holes formed in the interlayer dielectric layer, the target insulating layer, and the gate insulating layer; and the signal trace includes a first signal line and a second signal line insulated from each other, the first signal line is connected with the capacitor plate through a via hole in the interlayer dielectric layer, and the second signal line is connected with the gate through the via holes formed in the interlayer dielectric layer and the target insulating layer.

Optionally, the light emitting device includes an anode, a pixel defining layer, a light emitting layer, and a cathode that are sequentially arranged on a side, distal from the base substrate, of the thin film transistor; and the anode is connected with one of the source and the drain through a via hole formed in the flattened layer.

Optionally, the gate insulating layer includes a first sub-gate insulating layer and a second sub-gate insulating layer that are arranged in a stack manner, and the isolation dams includes a first inorganic layer, a second inorganic layer, a third inorganic layer, and a fourth inorganic layer that are sequentially stacked along a direction away from the base substrate; and the first inorganic layer is arranged in a same layer as the buffer layer, the second inorganic layer is arranged in a same layer as the first sub-gate insulating layer, the third inorganic layer is arranged in a same layer as the second sub-gate insulating layer, and the fourth inorganic layer is arranged in a same layer as the interlayer dielectric layer.

In a second aspect, a display device is provided. The display device includes the display substrate according to any one of the first aspect.

DETAILED DESCRIPTION

The implementations of the present disclosure will be described in further detail with reference to the accompanying drawings, to present the objects, technical solutions, and advantages of the present disclosure more clearly.

Figure 1:
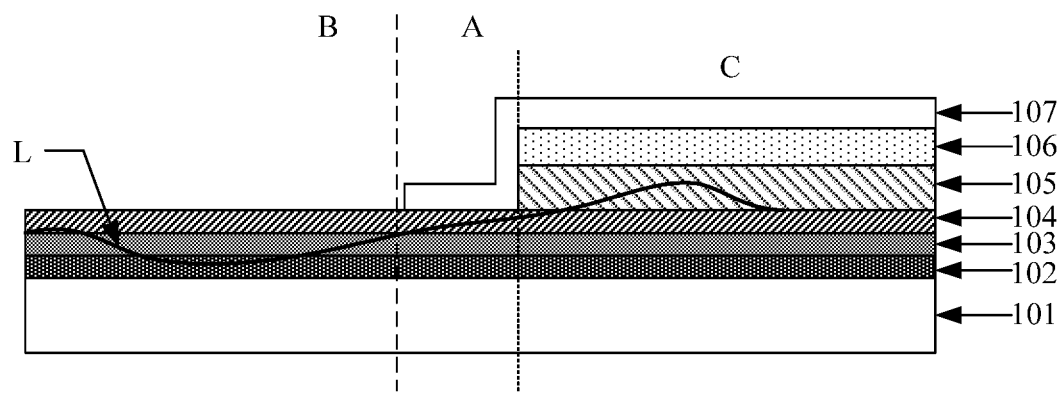
FIG. 1 is a schematic structural diagram of an OLED display substrate known to the inventor.

FIG. 1 is a schematic structural diagram of an OLED display substrate known to the inventor. As shown in FIG. 1, the OLED display substrate has an encapsulation region A and a periphery region B. A display region C of the OLED display substrate is located within the encapsulation region A.

Referring to FIG. 1, the OLED display substrate includes a base substrate 101, and a buffer layer 102, a gate insulating layer 103, an interlayer dielectric layer 104, a flattened layer 105, an OLED device 106, and an encapsulation layer 107 that are stacked along a direction away from the base substrate 101. It should be noted that, in the display region C of the OLED display substrate, other film layers, such as a gate layer, a source-drain layer, an active layer and the like, are also included, which are not shown in FIG. 1.

The OLED display substrate, as a flexible display substrate, typically adopts a flexible substrate as the base substrate. Therefore, when the OLED display substrate is collided or bent during the manufacturing and using processes, the film layers within the periphery region are prone to being cracked. In the OLED display substrate shown as FIG. 1, a crack L formed on a film layer in the periphery region B is likely to extend onto a film layer in the encapsulation region A, leading to the encapsulation of the OLED display substrate being ineffective. Then, moisture, oxygen or the like in air may probably invade into the interior of the OLED display substrate through the crack, resulting in dysfunction of the organic light emitting material and thus influencing the quality of the OLED display substrate.

Figure 2:
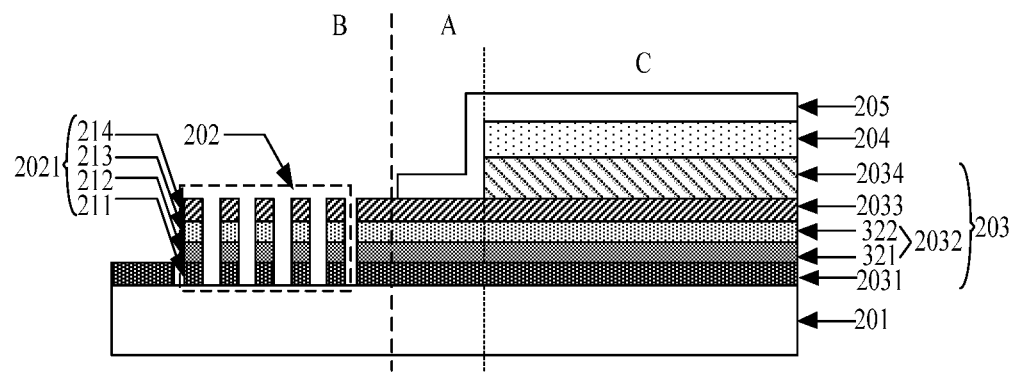
FIG. 2 is a schematic structural diagram of a display substrate provided by an embodiment of the present disclosure.

FIG. 2 is a schematic structural diagram of a display substrate provided by an embodiment of the present disclosure. As shown in FIG. 2, the display substrate has an encapsulation region A and a periphery region B surrounding the encapsulation region A.

Referring to FIG. 2, the display substrate includes a base substrate 201 and a partition structure 202. The partition structure 202 is located on a side of the base structure 201 and within the periphery region B.

Here, the encapsulation region A is in a polygonal shape. Optionally, FIG. 3 is a top view schematic diagram of a display substrate provided by an embodiment of the present disclosure, as shown in FIG. 3, the encapsulation region A may be in an octagonal shape.

In the embodiment of the present disclosure, the encapsulation region of the display substrate refers to a region covered by an encapsulation layer in the display substrate, and thus, an edge of the encapsulation region may refer to the edge of the encapsulation layer, or a boundary between the encapsulation region and the periphery region. For ensuring effective encapsulation of the display region of the display substrate, the edge of the encapsulation layer is generally arranged in a non-display region of the display substrate, for example, referring to FIG. 2 or 3, the display region C of the display substrate is located within the encapsulation region A.

Optionally, the shape of the encapsulation region A is similar to the shape of the display region C, that is, the encapsulation region A and the display region C are identical in shape but different in size.

Figure 3:
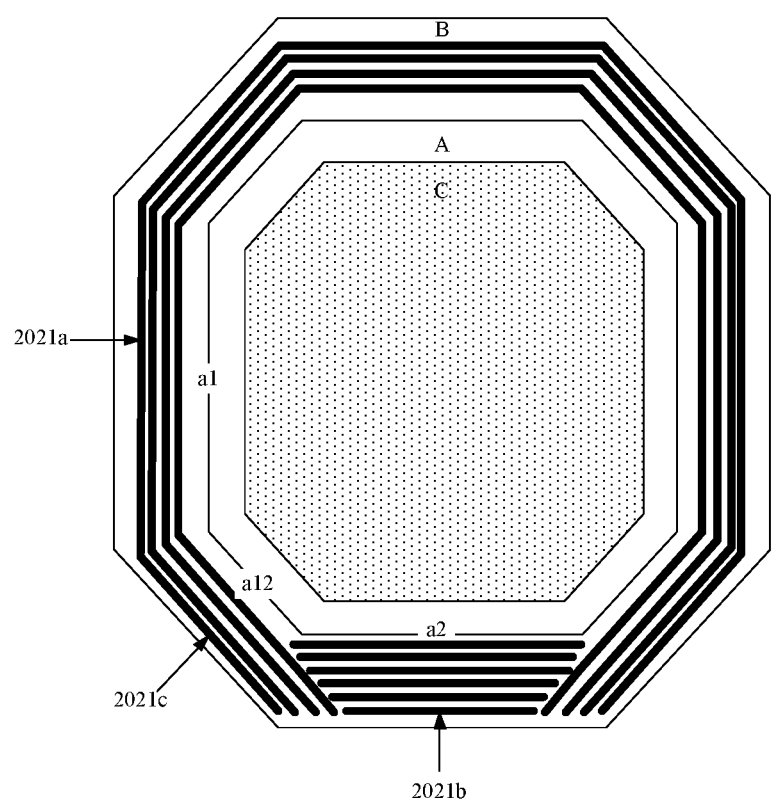
FIG. 3 is a top view schematic diagram of a display substrate provided by an embodiment of the present disclosure.

With continued reference to FIG. 2 and FIG. 3, the partition structure 202 may include a plurality of isolation dams 2021 located at a side of a plurality of edges of the encapsulation region A, and the plurality of isolation dams 2021 at a side of a same edge of the encapsulation region A are arranged at intervals along a direction away from the encapsulation region A. Here, it can be determined from the figures that, by describing a partition structure, or specifically an isolation dam, to be located "at a side of" or "outside" a certain edge, it is indicated that the partition structure or isolation dam is located on a side of the edge away from the encapsulation region.

Optionally, the plurality of isolation dams 2021 at a side of a same of the encapsulation region A are arranged at equal intervals along a direction away from the encapsulation region A.

With continued reference to FIG. 3, the encapsulation region A has a first edge a1 and a second edge a2. First isolation dams 2021a at a side of the first edge a1 in the encapsulation region A are not in connection with a plurality of second isolation dams 2021b at a side of the second edge a2 in the encapsulation region A, and the number of the second isolation dams 2021b is greater than the number of the first isolation dams 2021a.

Figure 4:
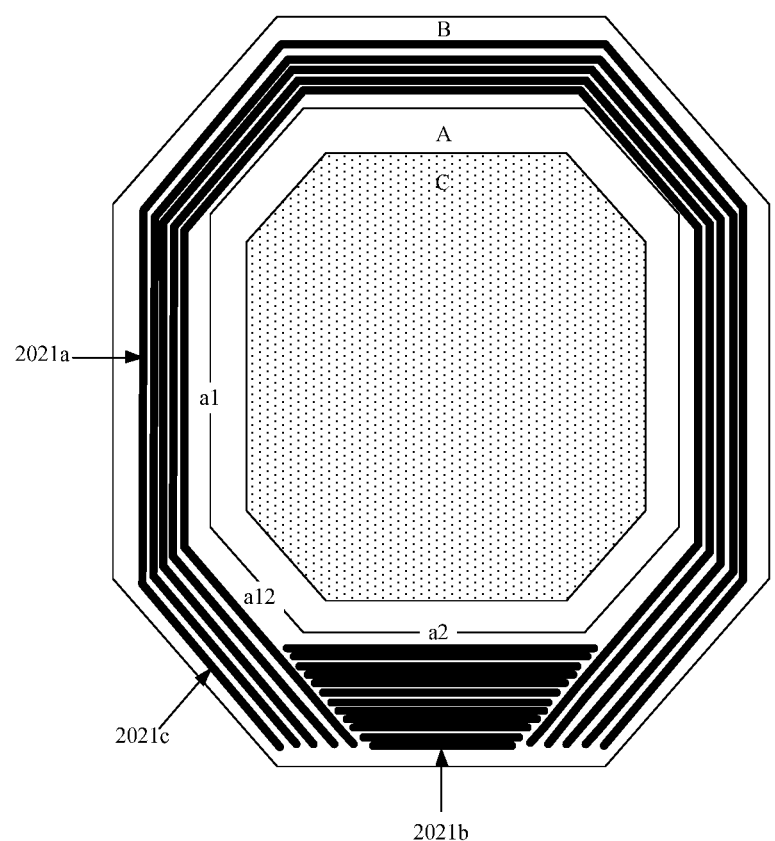
FIG. 4 is a top view schematic diagram of another display substrate provided by an embodiment of the present disclosure.

Optionally, the number of the second isolation dams is 2 to 3 times the number of the first isolation dams. For example, the number of the second isolation dams may be 2.4 times the number of the first isolation dams. Illustratively, FIG. 4 is a top view schematic diagram of another display substrate provided by an embodiment of the present disclosure. As shown in FIG. 4, the number of the first isolation dams 2021a is 5, and the number of the second isolation dams 2021b is 12.

In the embodiment of the present disclosure, the number of the isolation dams arranged at a side of each edge of the encapsulation region can be determined according to the probability of a crack occurring in the film layers, at a side of different edges of the encapsulation region, in the periphery region, during the actual manufacturing and using processes of the display substrate. For example, the number of the isolation dams at a side of a specific edge of the encapsulation region is positively correlated with the probability of a crack occurring in the film layers, at a side of that edge of the encapsulation region, in the periphery region. The higher the frequency at which the periphery region is prone to be bent or collided is, the larger the stress received by the interior upon being bent or collided is, then, the higher the probability of a crack occurring in the film layers in that periphery region is.

Optionally, the display substrate according to the embodiment of the present disclosure may be a flexible display substrate. The base substrate in the display substrate may be made of a flexible material (for example, polyimide (PI)). Exemplarily, the display substrate may be an OLED display substrate, a quantum dot light emitting diodes (QLED) display substrate or the like.

In summary, in the display substrate provided by the embodiment of the present disclosure, as partition structure is arranged in the periphery region of the display substrate, the partition structure can prevent a crack, coming from a film layer in the periphery region, from extending to a film layer in the encapsulation region, which ensures the reliability in the encapsulation of the display substrate. In addition, in practical use, the display substrate may have different probabilities of a crack occurring at different positions, therefore, different numbers of isolation dams can be arranged in positions, at the side of different edges of the encapsulation region, of the periphery region, so that the display substrate can have different capabilities in blocking the cracks in different directions. Furthermore, as the first isolation dams are not in connection with the second isolation dams, the internal stress generated from the collision of first isolation dams can be prevented from being transferred to the second isolation dams, and thus the cracks generated in the first isolation dams can also be prevented from extending toward the second isolation dams, thereby ensuring the structural stability of the partition structure and the quality of the display substrate.

Optionally, with continued reference to FIG. 3 and FIG. 4, the encapsulation region A may further has a first corner edge a12. The first corner edge a12 is located between the first edge a1 and the second edge a2. Two ends of the first corner edge a12 are respectively connected with the first edge a1 and the second edge a2. The length of the first corner edge a12 is less than both the length of the first edge a1 and the length of the second edge a2 (in the figures according to the embodiment of the present disclosure, the relationship among the lengths of the first edge, the second edge and the first corner edge is only shown for illustration, and the length of the first corner edge is much less than the length of the first edge and the length of the second edge in practice). The number of the first corner isolation dams 2021c on the side of the first corner edge a12 is equal to the number of the first isolation dams 2021a, and the first isolation dams 2021a and the first corner isolation dams 2021c are in a continuous and integral structure. The plurality of second isolation dams 2021b are not in connection with the plurality of first corner isolation dams 2021c. In the embodiment of the present disclosure, the length of the first corner edge refers to the straight-line distance between two endpoints of the first corner edge.

Figure 5:
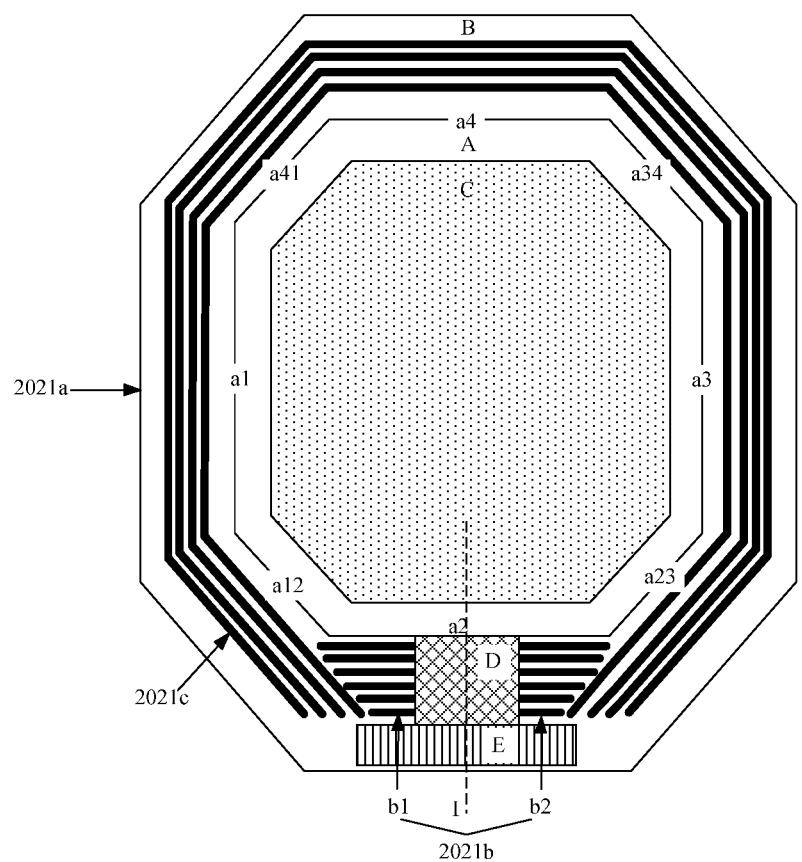
FIG. 5 is a top view schematic diagram of yet another display substrate provided by an embodiment of the present disclosure.

Optionally, FIG. 5 is a top view schematic diagram of yet another display substrate provided by an embodiment of the present disclosure. As shown in FIG. 5, the display substrate further includes a fan-out region D. In the encapsulation region A, the first edge a1 is perpendicular to the second edge a2. The second edge a2 is an edge proximal to the fan-out region D. The encapsulation region A further has a third edge a3, a second corner edge a23, a fourth edge a4, a third corner edge a34, and a fourth corner edge a41. The second corner edge a23 is located between the second edge a2 and the third edge a3, and two ends of the second corner edge a23 are respectively connected with the second edge a2 and the third edge a3. The fourth edge a4 is parallel to the second edge a2. The third corner edge a34 is located between the third edge a3 and the fourth edge a4, and two ends of the third corner edge a34 are respectively connected with the third edge a3 and the fourth edge a4. The fourth corner edge a41 is located between the fourth edge a4 and the first edge a1, and two ends of the fourth corner edge a41 are respectively connected with the fourth edge a4 and the first edge a1.

Optionally, with continued reference to FIG. 5, the first corner edge a12, the second corner edge a23, the third corner edge a34 and the fourth corner edge a41 are all oblique straight-line edges. The first corner edge a12 is parallel to the third corner edge a34, and the second corner edge a23 is parallel to the fourth corner edge a41. In the embodiment of the present disclosure, the first corner edge, the second corner edge, the third corner edge and the fourth corner edge may also be circular arc edges.

Optionally, with continued reference to FIG. 5, orthographic projections of the second isolation dams 2021b onto the base substrate 201 do not overlap with the fan-out region D. It can be seen from the FIG. 5 that, although the orthographic projections of the second isolation dams 2021b onto the base substrate 201 and the fan-out region D have a common boundary, such common boundary is not taken into consideration when discussing whether the orthographic projections overlap. The second isolation dams 2021b include a plurality of first sub-isolation dams b1 and a plurality of second sub-isolation dams b2. The plurality of first sub-isolation dams b1 are located on a side, proximal to the first edge a1, of the fan-out region D, and the plurality of second sub-isolation dams b2 are located on a side, proximal to the third edge a3, of the fan-out region D. The plurality of first sub-isolation dams b1 and the plurality of second sub-isolation dams b2 are symmetrically arranged with respect to a perpendicular bisector I of the second edge a2.

Optionally, with continued reference to FIG. 5, the display substrate may further include a bonding region E located on a side, distal from the second edge a2, of the fan-out region D. The bonding region E meets the fan-out region D. The orthographic projections of the second isolation dams 2021 onto the base substrate 201 neither overlap with the fan-out region D nor the bonding region E.

It should be noted that, the fan-out region and the bonding region are typically arranged at the bottom of the display substrate, that is, in the encapsulation region, the second edge is a bottom edge and the first edge is a side edge. The number of the second isolation dams is greater than the number of the first isolation dams, that is, the number of the isolation dams at a side of the bottom edge of the encapsulation region is greater than the number of the isolation dams at a side of the side edge of the encapsulation region. In practical use of the display substrate (for example, when the display substrate is applied to terminals such as a mobile phone), the frequency of collisions at the bottom is typically higher than the frequency of collisions at the side face. Therefore, as compared with the isolation dams arranged in the periphery region corresponding to the side of the side edge of the encapsulation region, more isolation dams can be arranged in the periphery region corresponding to the side of the bottom edge of the encapsulation region, so that the capability of the partition structure in preventing a crack formed at bottom of the display substrate from extending to the interior can be adaptively improved.

Figure 6:
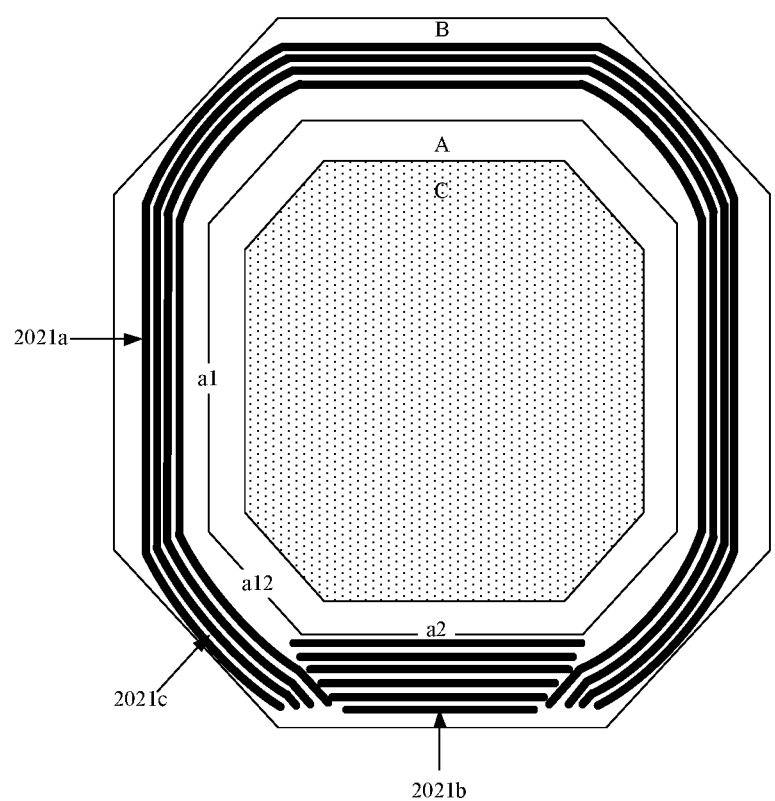
FIG. 6 is a top view schematic diagram of still another display substrate provided by an embodiment of the present disclosure.

Optionally, the corner isolation dams in the embodiment of the present disclosure may have either of a linear structure and an arch-shaped structure. For example, in the display substrate as shown in FIG. 3 and FIG. 5, the corner isolation dams may have a linear structure. Optionally, FIG. 6 is a top view schematic diagram of still another display substrate provided by an embodiment of the present disclosure, as shown in FIG. 6, the corner isolation dams may have an arch-shaped structure.

Optionally, referring to the display substrate as shown in any one of FIG. 3 to FIG. 6, the isolation dams at a side of any edge of the encapsulation region A extend in a substantially same direction as the edge, that is, an included angle between the extension direction of the isolation dams the side of any edge of the encapsulation region A and the extension direction of the edge is smaller than a specified angle. Exemplarily, the specified angle may be 5 degrees.

Optionally, referring to the display substrate as shown in any one of FIG. 3 to FIG. 6, a plurality of endpoints, at the end proximal to the first corner isolation dams 2021c, of the plurality of the second isolation dams 2021b are arranged in a straight line parallel to an extension direction of the first corner isolation dams 2021c.

Optionally, with continued reference to the display substrate as shown in any one of FIG. 3 to FIG. 6, a plurality of endpoints, at the end distal from the first isolation dams 2021a, of the plurality of the first corner isolation dams 2021c are arranged in a straight line parallel to an extension direction of the second isolation dams 2021b. Optionally, a plurality of endpoints, at the end distal from the first isolation dams 2021a, of the plurality of the first corner isolation dams 2021c, are arranged in a same straight line together with the farthest second isolation dam from the encapsulation region A in the plurality of second isolation dams 2021*b*.

Figure 7:
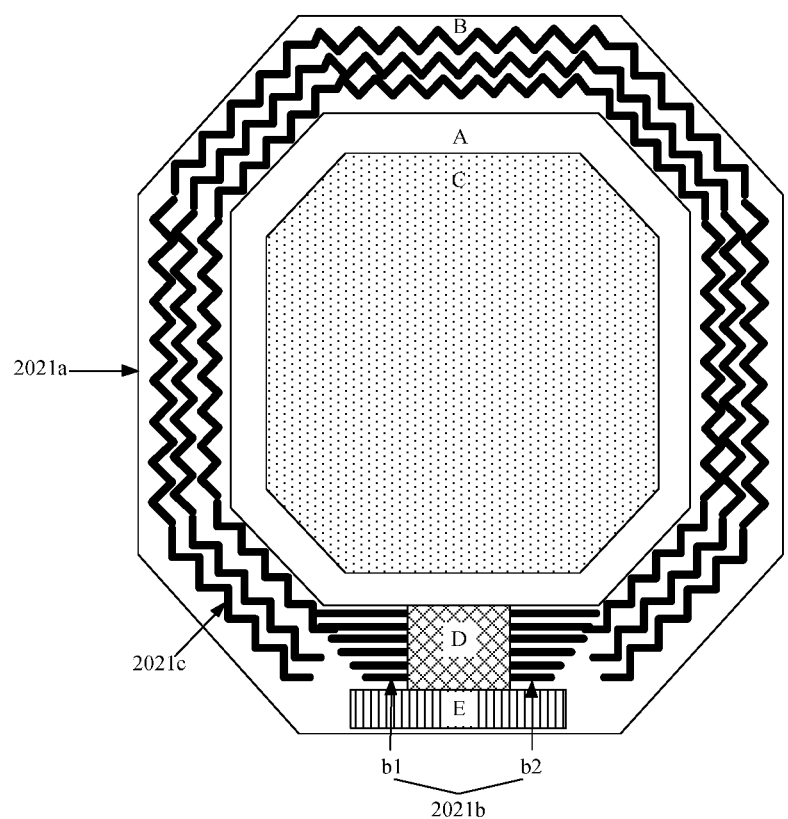
FIG. 7 is a top view schematic diagram of yet still another display substrate provided by an embodiment of the present disclosure.

Optionally, in the embodiment of the present disclosure, the isolation dams may have at least one of a stripe structure, a zigzag structure, and an arcuate structure. Illustratively, referring to the display substrate as shown in any one of FIG. 3 to FIG. 6, the isolation dams may have a stripe structure. FIG. 7 is a top view schematic diagram of yet still another display substrate provided by an embodiment of the present disclosure. As shown in FIG. 7, the isolation dams 2021 may have a zigzag structure. Optionally, the isolation dams 2021 may otherwise have an arcuate structure. For example, the arcuate structure includes an arch-shaped structure and an S-shaped structure.

It should be noted that, by arranging the isolation dams to have a zigzag structure or arc structure, when the edge of the display substrate is collided, the isolation dams can release the stress more effectively, and the impact resistance of the display substrate can be improved.

Optionally, referring to the display substrate as shown in any one of FIG. 3 to FIG. 7, the isolation dams at a side of target edges of the encapsulation region A are in a continuous and integral structure, and the target edges include all other edges, except the second edge a2, of the encapsulation region A.

Figure 8:
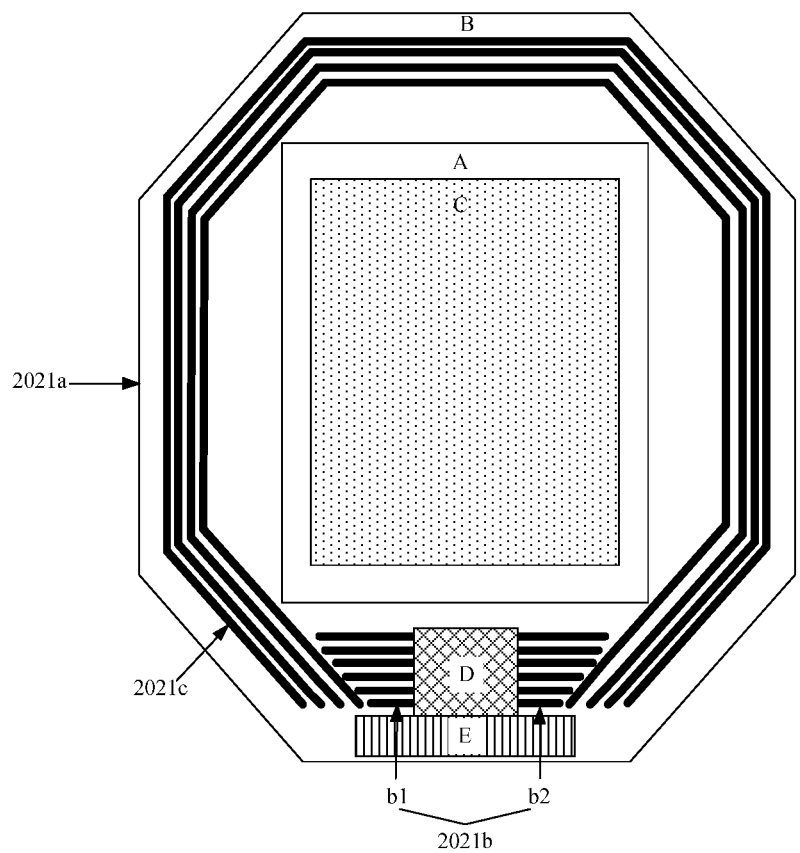
FIG. 8 is a top view schematic diagram of a display substrate provided by another embodiment of the present disclosure.

The display substrates as shown in FIG. 3 to FIG. 7 are all illustrated with the encapsulation region A and the display region C being in an octagonal shape as an example. Optionally, when the encapsulation region A and the display region C are both in a rectangular shape, the partition structure 202 may also be arranged like those in the display substrate as shown in any one of FIG. 3 to FIG. 7. Illustratively, FIG. 8 is a top view schematic diagram of a display substrate provided by another embodiment of the present disclosure. As shown in FIG. 8, the encapsulation region A and the display region C of the display substrate are both in a rectangular shape, and arrangements of the isolation dams are identical to arrangements of the isolation dams in the display substrate as shown in FIG. 5.

Figure 9:
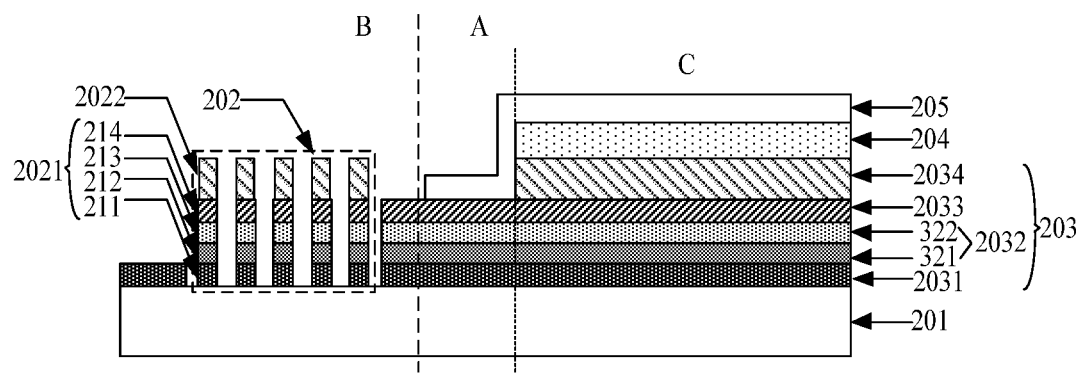
FIG. 9 is a schematic structural diagram of another display substrate provided by an embodiment of the present disclosure.

Optionally, the isolation dams may be prepared from an inorganic material. Referring to FIG. 2, the inorganic layers located within the periphery region of the display substrate have a plurality of grooves at intervals, and the inorganic layer between two adjacent grooves forms one isolation dam. FIG. 9 is a schematic structural diagram of another display substrate provided by an embodiment of the present disclosure. As shown in FIG. 9, the partition structure 202 may further include an organic layer 2022 covering the isolation dams 2021, and orthographic projections of the isolation dams 2021 onto the base substrate 201 are within an orthographic projection of the organic layer 2022 onto the base substrate 201.

It should be noted that, by covering the isolation dams with the organic layer, the organic layer can protect the isolation dams, improve the structural stability of the isolation dams while enhancing the impact resistance of the isolation dams, thereby improving the capability of the partition structure in preventing the crack from extending.

Optionally, as shown in FIG. 9, the organic layer 2022 is on a side, distal from the base substrate 201, of the isolation dams 2021, and the orthographic projections of the isolation dams 2021 onto the base substrate 201 and the orthographic projection of the organic layer 2022 onto the base substrate 201 coincide.

It should be noted that, when the periphery region of the display substrate is collided from a direction perpendicular to the base substrate, the organic layer can have a buffering function to protect the isolation dams.

Figure 10:
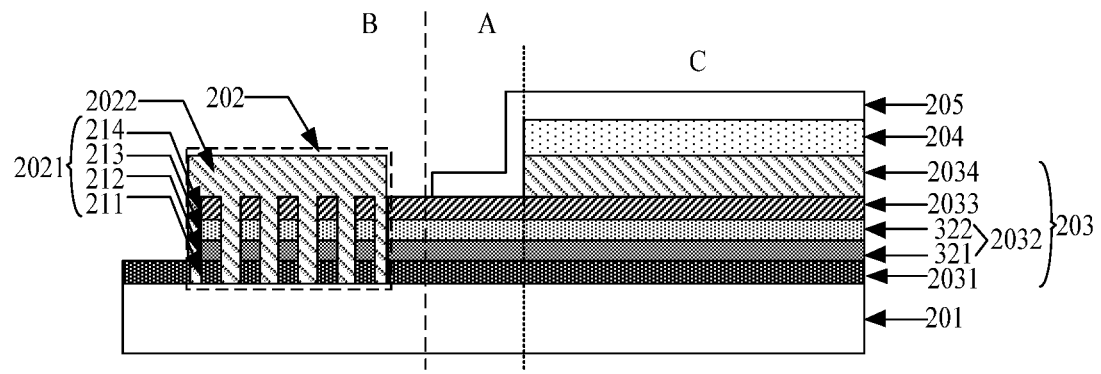
FIG. 10 is a schematic structural diagram of yet another display substrate provided by an embodiment of the present disclosure.

Optionally, FIG. 10 is a schematic structural diagram of yet another display substrate provided by an embodiment of the present disclosure. As shown in FIG. 10, all the surfaces, except a target surface, of the isolation dams 2021 are coated with the organic layer 2022, the target surface being a surface of the isolation dams 2021 adjoining the base substrate 201.

It should be noted that, when the periphery region of the display substrate is collided from a direction perpendicular or parallel to the base substrate, the organic layer can have a buffering function to protect the isolation dams.

Optionally, the partition structure satisfies at least one of the following conditions: the organic layer in the partition structure is arranged in the same layer as an organic film layer in the encapsulation region. The isolation dams in the partition structure are arranged in the same layer(s) as inorganic film layer(s) in the encapsulation region.

Optionally, with continued reference to FIG. 2, FIG. 9, or FIG. 10, a thin film transistor 203, a light emitting device 204, and an encapsulation layer 205 are sequentially arranged in the display region C along a direction away from the base substrate 201. The thin film transistor 203 includes a buffer layer 2031, an active layer (not shown in the figures), a gate insulating layer 2032, a gate pattern (not shown in the figures), an interlayer dielectric layer 2033, a source-drain pattern (not shown in the figures), and a flattened layer 2034 that are sequentially arranged along a direction away from the base substrate 201.

Referring to FIG. 2, FIG. 9 or FIG. 10, the isolation dams 2021 are arranged in the same layer as at least one inorganic film layer of the thin film transistor 203, wherein the inorganic film layers of the thin film transistor 203 include the buffer layer 2031, the gate insulating layer 2032, and the interlayer dielectric layer 2033.

Optionally, the materials for preparing the buffer layer, the gate insulating layer and the interlayer dielectric layer may include at least one of silicon dioxide, silicon nitride and aluminum oxide. The materials for preparing the buffer layer, the gate insulating layer and the interlayer dielectric layer may be the same or different, which is not limited in the embodiment of the present disclosure. Arranging the isolation dams in the partition structure in the same layer(s) as the inorganic film layer(s) in the encapsulation region may include: the isolation dams in the partition structure being a single-layer structure, and being manufactured together with an inorganic film layer in the encapsulation region in a single patterning process; or, the isolation dams in the partition structure being a multi-layer structure, and each layer of the isolation dams being manufactured along with a corresponding inorganic film layer in the encapsulation region in a single patterning process. By arranging the isolation dams in the same layer(s) as the inorganic film layer(s) of the thin film transistor, the manufacturing cost and the complexity of the manufacturing process of the display substrate can be prevented from being increased.

Referring to FIG. 9 or 10, the organic layer 2022 is arranged in the same layer as the flattened layer 2034.

Optionally, the flattened layer may be prepared from an organic resin material. For example, the flattened layer may be prepared from a polyimide (PI) material or polymethyl methacrylate (PMMA). It should be noted that, the organic layer in the partition structure is arranged in the same layer as the flattened layer in the encapsulation region, that is, the organic layer in the partition structure and the flattened layer in the encapsulation region are manufactured in a single patterning process, so that the manufacturing cost and the complexity of the manufacturing process of the display substrate can be prevented from being increased.

Optionally, with continued reference to FIG. 2, FIG. 9, or FIG. 10, the gate insulating layer 2032 includes a first sub-gate insulating layer 321 and a second sub-gate insulating layer 322 that are arranged in a stacked manner. The isolation dam 2021 includes a first inorganic layer 211, a second inorganic layer 212, a third inorganic layer 213, and a fourth inorganic layer 214 that are stacked along a direction away from the base substrate 201. The first inorganic layer 211 is arranged in the same layer as the buffer layer 2031, the second inorganic layer 212 is arranged in the same layer as the first sub-gate insulating layer 321, the third inorganic layer 213 is arranged in the same layer as the second sub-gate insulating layer 322, and the fourth inorganic layer 214 is arranged in the same layer as the interlayer dielectric layer 2033.

Figure 11:
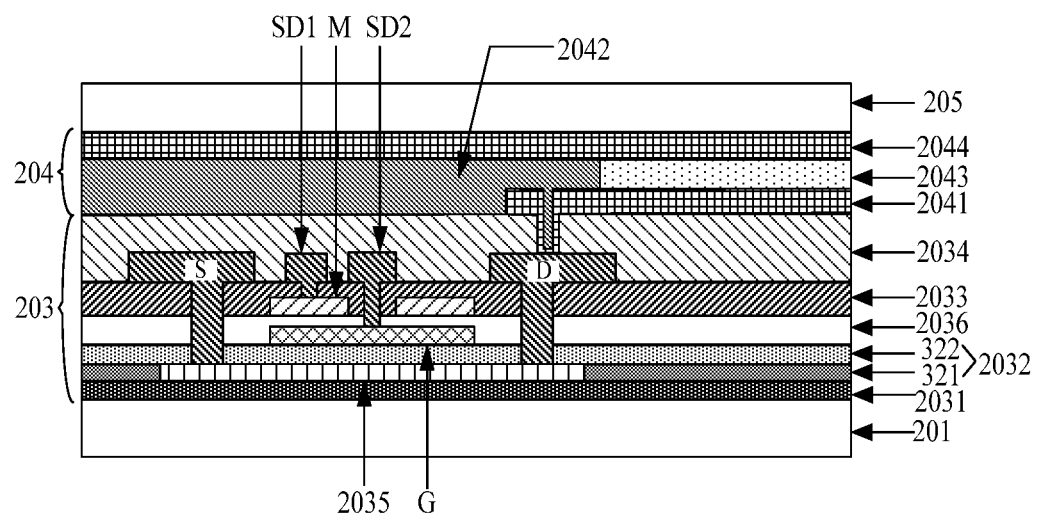
FIG. 11 is a cross-sectional schematic view, taken within the display region, of a display substrate provided by an embodiment of the present disclosure.

Optionally, FIG. 11 is a cross-sectional schematic view, taken within the display region, of a display substrate provided by an embodiment of the present disclosure. As shown in FIG. 11, in the display region of the display substrate, a thin film transistor 203, a light emitting device 204 and an encapsulation layer 205 are sequentially arranged along a direction away from the base substrate 201. The thin film transistor 203 includes a buffer layer 2031, an active layer 2035, a gate insulating layer 2032, a gate pattern, an interlayer dielectric layer 2033, a source-drain pattern, and a flattened layer 2034 that are sequentially arranged along a direction away from the base substrate 201. Here, the gate insulating layer 2032 includes a first sub-gate insulating layer 321 and a second sub-gate insulating layer 322 that are arranged in a stacked manner.

Optionally, with continued reference to FIG. 11, the source-drain pattern includes a source S, a drain D, and a signal trace. The gate pattern includes a gate G. The thin film transistor 203 further includes a target insulating layer 2036 and a capacitor plate M located between the gate G and interlayer dielectric layer 2033. The orthographic projection of the capacitor plate M onto the base substrate 201 overlaps with an orthographic projection of the gate G onto the base substrate 201.

Referring to FIG. 11, the source S and the drain D are respectively connected with the active layer 2035 through via holes in the interlayer dielectric layer 2033, the target insulating layer 2036, and the gate insulating layer 2032. The signal trace includes a first signal line SD1 and a second signal line SD2 that are insulated from each other. The first signal line SD1 is connected with the capacitor plate M through the via hole in the interlayer dielectric layer 2033, and the second signal line SD2 is connected with the gate G through the via holes in the interlayer dielectric layer 2033 and the target insulating layer 2036. The first signal line SD1 is used for providing a first level signal to the capacitor plate M, the second signal line SD2 is used for providing a second level signal to the gate G, and thus a capacitance is formed between the capacitor plate M and the gate G.

Optionally, with continued reference to FIG. 11, the light emitting device 204 includes an anode 2041, a pixel defining layer 2042, a light emitting layer 2043, and a cathode 2044 that are sequentially arranged on the side, distal from the base substrate 201, of the thin film transistor 203. The anode 2041 is connected with one of the source S and the drain D through the via hole in the flattened layer 2034. Here, the light emitting layer may include a hole injection layer, a hole transport layer, a light emitting material layer, an electron transport layer, and an electron injection layer that are stacked along a direction away from the base substrate.

In summary, in the display substrate provided by the embodiment of the present disclosure, as partition structure is arranged in the periphery region of the display substrate, the partition structure can prevent a crack, coming from a film layer in the periphery region, from extending to a film layer in the encapsulation region, which ensures the reliability in the encapsulation of the display substrate. In addition, in practical use, the display substrate may have different probabilities of a crack occurring at different positions, therefore, different numbers of isolation dams can be arranged in positions, at the side of different edges of the encapsulation region, of the periphery region, so that the display substrate can have different capabilities in blocking the cracks in different directions. Furthermore, as the first isolation dams are not in connection with the second isolation dams, the internal stress generated from the collision of first isolation dams can be prevented from being transferred to the second isolation dams, and thus the cracks generated in the first isolation dams can also be prevented from extending towards the second isolation dams, thereby ensuring the structural stability of the partition structure and the quality of the display substrate.

Furthermore, by covering the isolation dams with the organic layer, the organic layer can protect the isolation dams, improve the structural stability of the isolation dams while enhancing the impact resistance of the isolation dams, thereby improving the capability of the partition structure in preventing the crack from extending.

The embodiment of the present disclosure provides a display device. The display device includes the display substrate as shown in any one of FIG. 2 to FIG. 11. The display device may be any product or component having a display function, such as a liquid crystal display panel, electronic paper, an OLED panel, an active matrix OLED (AMOLED) panel, a QLED panel, a mobile phone, a tablet computer, a television, a display, a notebook computer, a digital photo frame, a navigator or the like. The AMOLED panel may be a flexible display panel.

Figure 12:
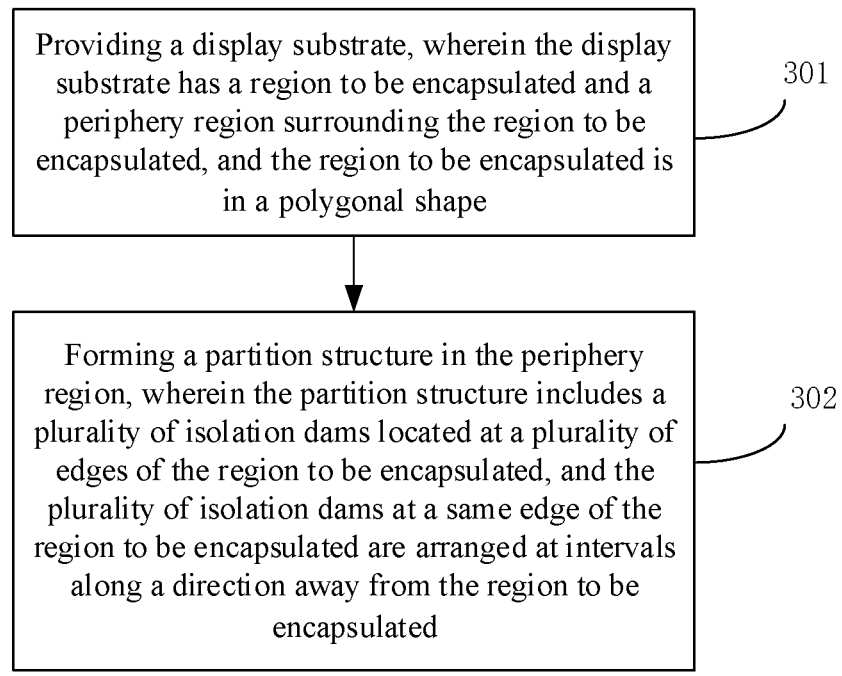
FIG. 12 is a flowchart of a method for manufacturing a display substrate provided by an embodiment of the present disclosure.

FIG. 12 is a flowchart of a method for manufacturing a display substrate provided by an embodiment of the present disclosure. As shown in FIG. 12, the method may include the following steps.

In step 301, a display substrate is provided, wherein the display substrate has a region to be encapsulated and a periphery region surrounding the region to be encapsulated, and the region to be encapsulated is in a polygonal shape.

In step 302, a partition structure is formed in the periphery region, wherein the partition structure includes isolation dams located at a side of a plurality of edges of the region to be encapsulated, and the plurality of isolation dams on a side of a same edge of the region to be encapsulated are arranged at intervals along a direction away from the region to be encapsulated.

Here, the region to be encapsulated has a first edge and a second edge, a plurality of first isolation dams at the first edge are not in connection with a plurality of second isolation dams at a side of the second edge, and the number of the second isolation dams is greater than the number of the first isolation dams.

In summary, in the method for manufacturing the display substrate provided by the embodiment of the present disclosure, as partition structure is arranged in the periphery region of the display substrate, the partition structure can prevent a crack, coming from a film layer in the periphery region, from extending to a film layer in the encapsulation region, which ensures the reliability in the encapsulation of the display substrate. In addition, in practical use, the display substrate may have different probabilities of a crack occurring at different positions, therefore, different numbers of isolation dams can be arranged in positions, at the side of different edges of the encapsulation region, of the periphery region, so that the display substrate can have different capabilities in blocking the cracks in different directions. Furthermore, as the first isolation dams are not in connection with the second isolation dams, the internal stress generated from the collision of first isolation dams can be prevented from being transferred to the second isolation dams, and thus the cracks generated in the first isolation dams can also be prevented from extending towards the second isolation dams, thereby ensuring the structural stability of the partition structure and the quality of the display substrate.

Figure 13:
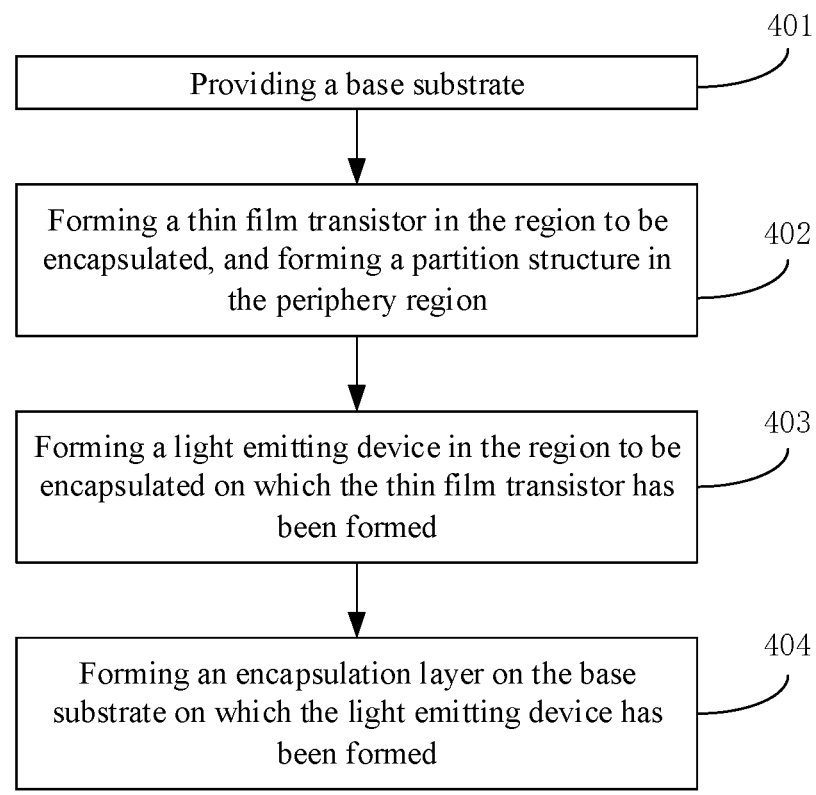
FIG. 13 is a flowchart of another method for manufacturing a display substrate provided by an embodiment of the present disclosure.

FIG. 13 is a flowchart of a method for manufacturing another display substrate provided by an embodiment of the present disclosure. As shown in FIG. 13, the method includes the following steps.

In step 401, a base substrate is provided.

Here, the base substrate has a region to be encapsulated and a periphery region surrounding the region to be encapsulated.

In the embodiment of the present disclosure, the base substrate is served as a support for preparing the film layer structures. Optionally, the base substrate may be a flexible base substrate. For example, the base substrate may be manufactured from a PI material.

In step 402, a thin film transistor is formed within the region to be encapsulated, and a partition structure is formed within the periphery region.

Optionally, the partition structure includes isolation dams and an organic layer covering the isolation dams, wherein orthographic projections of the isolation dams onto the base substrate fall into an orthographic projection of the organic layer onto the base substrate.

Optionally, the isolation dams may be arranged in the same layer(s) as inorganic film layer(s) in the thin film transistor. The inorganic film layers in the thin film transistor may include a buffer layer, a gate insulating layer, and an interlayer dielectric layer. The materials for preparing the buffer layer, the gate insulating layer, and the interlayer dielectric layer may include at least one of silicon dioxide, silicon nitride, and aluminum oxide. The materials for preparing the buffer layer, the gate insulating layer, and the interlayer dielectric layer may be the same or different, which is not limited in the embodiment of the present disclosure. An inorganic pattern in the partition structure may be a single-layer structure, and the inorganic pattern and a certain inorganic film layer in the encapsulation region are manufactured in a single patterning process; or, the inorganic pattern in the partition structure may be a multilayer structure, and each layer structure in the inorganic pattern and a corresponding inorganic film layer in the encapsulation region are manufactured in a single patterning process. By arranging the isolation dams in the same layer(s) as the inorganic film layer(s) of the thin film transistor, the manufacturing cost and the complexity of the manufacturing process of the display substrate can be prevented from being increased.

Optionally, the organic layer in the partition structure may be arranged in the same layer as the flattened layer of the thin film transistor. Optionally, the flattened layer may be prepared from an organic resin material. For example, the flattened layer may be manufactured from the PI material or PMMA. Through a single patterning process, the flattened layer can be formed in the region to be encapsulated on which the thin film transistor has been formed, while an organic layer can be formed in the periphery region on which the inorganic pattern has been formed, so that the manufacturing cost and the complexity of the manufacturing process of the display substrate can be prevented from being increased.

Optionally, the thin film transistor may be a top-gate thin film transistor or a bottom-gate thin film transistor. Illustratively, taking the thin film transistor being a top-gate thin film transistor, and the isolation dams being a multi-layer structure as an example, the embodiment of the present disclosure makes illustration for the implementation process of the step 402.

In step 4021, buffer layer is formed in the region to be encapsulated, and a first inorganic sub-pattern is formed in the periphery region.

Optionally, a whole-layer structure is formed on the base substrate through a depositing process, then through a single patterning process, the buffer layer is formed in the region to be encapsulated, and a first inorganic sub-pattern is formed in the periphery region. The patterning process includes: photoresist coating, exposing to light, developing, etching and photoresist peeling.

In step 4022, an active layer is formed in the region to be encapsulated on which the buffer layer has been formed.

Optionally, the material for preparing the active layer includes at least one of indium gallium zinc oxide (IGZO), a-Si, low temperature poly-silicon (LTPS) and low temperature polycrystalline oxide (LTPO). For example, an active layer may be formed in the region to be encapsulated on which the buffer layer has been formed through a depositing process.

In step 4023, a gate insulating layer is formed in the region to be encapsulated on which the active layer has been formed, and a second inorganic sub-pattern is formed in the periphery region.

Optionally, a whole-layer structure is formed on the base substrate through a depositing process, then through a single patterning process, the gate insulating layer is formed in the region to be encapsulated, and a second inorganic sub-pattern is formed in the periphery region.

Optionally, the gate insulating layer may be formed by two patterning processes, that is, the gate insulating layer may include a first sub-gate insulating layer and a second sub-gate insulating layer that are arranged in a stacked manner.

In step 4024, a gate pattern is formed in the region to be encapsulated on which the gate insulating layer has been formed.

Optionally, the material for preparing the gate pattern includes at least one of aluminum, neodymium and molybdenum. A gate metal layer may be formed through a depositing process, and then the gate pattern is formed through a patterning process.

In step 4025, forming an interlayer dielectric layer in the region to be encapsulated on which the gate pattern has been formed, and a third inorganic sub-pattern is formed in the periphery region.

Optionally, a whole-layer structure is formed on the base substrate through a depositing process, then through a single patterning process, the interlayer dielectric layer is formed in the region to be encapsulated, and the third inorganic sub-pattern is formed in the periphery region.

In step 4026, a source-drain pattern is formed in the region to be encapsulated on which the interlayer dielectric layer has been formed.

Optionally, the material for preparing the source-drain pattern includes at least one of aluminum, neodymium and molybdenum. A source-drain metal layer may be formed through a depositing process, and then the source-drain pattern is formed through a patterning process.

In step 4027, a flattened layer is formed in the region to be encapsulated on which the source-drain pattern has been formed, and an organic layer is formed in the periphery region.

It should be noted that, the isolation dams prepared through the step 4021 to the step 4026 are multi-layered structure consisting of the first inorganic sub-pattern, the second inorganic sub-pattern, and the third inorganic sub-pattern.

Optionally, in the step 4021, the step 4023, and the step 4025, it may also applicable to form inorganic film layers in the periphery region, and after the three inorganic film layers have been formed in the periphery region, the inorganic pattern can be formed through a single patterning process.

In step 403, a light emitting device is formed in the region to be encapsulated on which the thin film transistor has been formed.

Optionally, the light emitting device may be an OLED device, a QLED device or the like. Exemplarily, the implementation process of step 505 may include: sequentially forming a first electrode, a first carrier injection layer, a first carrier transport layer, a light emitting material layer, a second carrier transport layer, a second carrier injection layer, and a second electrode in the region to be encapsulated on which the flattened layer has been formed. Here, when the first electrode is an anode, and the second electrode is a cathode, the first carriers are holes, and the second carriers are electrons. When the first electrode is the cathode, and the second edge is the anode, the first carriers are electrons, and the second carriers are holes.

In step 404, an encapsulation layer is formed on the base substrate on which the light emitting device has been formed.

Optionally, the encapsulation layer may be manufactured from an inorganic material. For example, the encapsulation layer may be prepared from a metal material through an evaporation process or patterning process; or, the encapsulation layer may be manufactured from an organic resin material. For example, the encapsulation layer may be prepared from the PMMA through the patterning process. The preparation material and the preparation process of the encapsulation layer are not limited in the embodiment of the present disclosure.

It should also be noted that the order of the steps in the method for manufacturing the display substrate provided in the embodiments of the present disclosure can be properly adjusted, and certain steps may be omitted or new step(s) can be added according to the specific situation. Variants of the methods, which can be readily envisaged by those skilled in the art within the technical scope disclosed by the present disclosure, shall fall within the protection scope of the present disclosure. Therefore, details are not described herein.

In summary, in the method for manufacturing the display substrate provided by the embodiment of the present disclosure, as partition structure is arranged in the periphery region of the display substrate, the partition structure can prevent a crack, coming from a film layer in the periphery region, from extending to a film layer in the encapsulation region, which ensures the reliability in the encapsulation of the display substrate. In addition, in practical use, the display substrate may have different probabilities of a crack occurring at different positions, therefore, different numbers of isolation dams can be arranged in positions, at the side of different edges of the encapsulation region, of the periphery region, so that the display substrate can have different capabilities in blocking the cracks in different directions. Furthermore, as the first isolation dams are not in connection with the second isolation dams, the internal stress generated from the collision of first isolation dams can be prevented from being transferred to the second isolation dams, and thus the cracks generated in the first isolation dams can also be prevented from extending towards the second isolation dams, thereby ensuring the structural stability of the partition structure and the quality of the display substrate.

Furthermore, by covering the isolation dams with the organic layer, the organic layer can protect the isolation dams, improve the structural stability of the isolation dams while enhancing the impact resistance of the isolation dams, thereby improving the capability of the partition structure in preventing the crack from extending.

The structure of the display substrate, and the materials, the effect, and the achieved beneficial effects thereof in the above method embodiments, have been described in details in the above structure embodiments and are not described in details here.

It should be noted that in the accompanying drawings, for clarity of the illustration, the dimension of the layers and regions may be scaled up. It can be understood that when an element or layer is described as being "on" another element or layer, the specified element or layer may be directly placed on the other element or layer, or e intermediate layer(s) may be present between the specified element or layer and the other element or layer. In addition, It should be understood that when an element or layer is described as being "under/below" another element or layer, the specified element or layer may be directly placed below the other element or layer, or at least one intermediate layer may be present between the specified element or layer and the other element or layer. In addition, it should be further understood that when a layer or element is described as being arranged "between" two layers or elements, the specified layer or element may be the only layer between the two layers or elements, or at least one intermediate layer or element may also be present between the two layers or elements. In the whole specification described above, like reference numerals denote like elements.

In the present disclosure, the terms "first" and "second" are merely used for describing objects but do not denote or imply any relative importance. The term "a plurality of" means two or more, unless otherwise expressly defined.

The term "and/or" in the embodiments of the present disclosure merely describes the association relationship between the associated objects, and indicates that there may be three relationships; for example, A and/or B may indicate three cases where only A exists, A and B exist at the same time, and only B exists. The character "/" in the present disclosure generally indicates that the former and later associated objects is in an "OR" relationship.

The foregoing descriptions are merely optional embodiments of the present disclosure, and are not intended to limit the present disclosure. Within the concept and principles of the disclosure, any modifications, equivalent substitutions, improvements, etc., are within the protection scope of the present disclosure.

What is claimed is:

1. A display substrate, having an encapsulation region with a plurality of edges and a periphery region surrounding the encapsulation region, and the display substrate comprising:
   a base substrate; and
   a partition structure, located on a side of the base substrate and within the periphery region, the partition structure comprising a plurality of isolation dams outside each of the plurality of edges of the encapsulation region, wherein the plurality of isolation dams outside a same edge of the encapsulation region are arranged at intervals along a direction away from the encapsulation region;
   wherein among the plurality of edges, the encapsulation region has a first edge and a second edge, an extending direction of the first edge intersects an extending direction of the second edge, a plurality of first isolation dams outside the first edge are not in connection with a plurality of second isolation dams outside the second edge, and a number of the second isolation dams is greater than a number of the first isolation dams;
   the isolation dams are prepared from an inorganic material; the partition structure further comprises an organic layer covering the isolation dams; and orthographic projections of the isolation dams onto the base substrate are within an orthographic projection of the organic layer onto the base substrate.

2. The display substrate according to claim 1, wherein the encapsulation region further has a first corner edge;
   the first corner edge is located between the first edge and the second edge, two ends of the first corner edge are respectively connected with the first edge and the second edge, and a length of the first corner edge is less than both a length of the first edge and a length of the second edge; and
   a number of first corner isolation dams outside the first corner edge is equal to the number of the first isolation dams, the first isolation dams and the first corner isolation dams are in a continuous and integral structure, and the plurality of second isolation dams are not in connection with the plurality of first corner isolation dams.

3. The display substrate according to claim 2, wherein the first corner isolation dams have one of a linear structure and an arc-shaped structure.

4. The display substrate according to claim 2, wherein the first edge is perpendicular to the second edge, the second edge is an edge proximal to a fan-out region of the display substrate, and the encapsulation region further has a third edge, a second corner edge, a fourth edge, a third corner edge and a fourth corner edge;
   the third edge is parallel to the first edge;
   the second corner edge is located between the second edge and the third edge, and two ends of the second corner edge are respectively connected with the second edge and the third edge;
   the fourth edge is parallel to the second edge;
   the third corner edge is located between the third edge and the fourth edge, and two ends of the third corner edge are respectively connected with the third edge and the fourth edge; and
   the fourth corner edge is located between the fourth edge and the first edge, and two ends of the fourth corner edge are respectively connected with the fourth edge and the first edge.

5. The display substrate according to claim 4, wherein the first corner edge, the second corner edge, the third corner edge, and the fourth corner edge are all oblique straight-line edges, the first corner edge is parallel to the third corner edge, and the second corner edge is parallel to the fourth corner edge.

6. The display substrate according to claim 4, wherein orthographic projections of the second isolation dams onto the base substrate do not overlap with the fan-out region, the second isolation dams comprise a plurality of first sub-isolation dams and a plurality of second sub-isolation dams, the plurality of first sub-isolation dams are located on a side, proximal to the first edge, of the fan-out region, and the plurality of second sub-isolation dams are located on a side, proximal to the third edge, of the fan-out region; and
   the plurality of first sub-isolation dams and the plurality of second sub-isolation dams are symmetrically arranged with respect to a perpendicular bisector of the second edge.

7. The display substrate according to claim 6, further comprising a bonding region located on a side, distal from the second edge, of the fan-out region, wherein the bonding region meets the fan-out region, and
   the orthographic projections of the second isolation dams onto the base substrate do not overlap with the fan-out region or the bonding region.

8. The display substrate according to claim 2, wherein for each edge of the encapsulation region, the isolation dams outside the edge extend in a substantially same direction as the edge.

9. The display substrate according to claim 8, wherein endpoints of the isolation dams meet at least one of the following:
   a plurality of endpoints, at an end proximal to the first corner isolation dams, of the plurality of the second isolation dams are arranged in a straight line parallel to an extension direction of the first corner isolation dams; and
   a plurality of endpoints, at an end distal from the first isolation dams, of the plurality of the first corner isolation dams are arranged in a straight line parallel to an extension direction of the second isolation dams.

10. The display substrate according to claim 9, wherein a plurality of endpoints, at an end distal from the first isolation dams, of the plurality of the first corner isolation dams are arranged in a same straight line, together with a farthest second isolation dam from the encapsulation region in the plurality of second isolation dams.

11. The display substrate according to claim 1, wherein the isolation dams meet at least one of the following:
   except the second edge of the encapsulation region, isolation dams outside all other edges of the encapsulation region are in a continuous and integral structure;
   the isolation dams have at least one of a stripe structure, a zigzag structure, and an arcuate structure.

12. The display substrate according to claim 1, wherein the organic layer is located on a side, distal from the base substrate, of the isolation dams; and orthographic projections of the isolation dams onto the base substrate and orthographic projection of the organic layer onto the base substrate coincide.

13. The display substrate according to claim 1, wherein all surfaces, except a target surface, of the isolation dams are coated with the organic layer, the target surface being a surface of the isolation dams adjoining the base substrate.

14. The display substrate according to claim 1, wherein the partition structure satisfies at least one of the following conditions:
the organic layer is arranged in a same layer as an organic film layer in the encapsulation region; and
the isolation dams are arranged in a same layer as an inorganic film layer in the encapsulation region.

15. The display substrate according to claim 14, wherein the display substrate has a display region located in the encapsulation region, a thin film transistor, a light emitting device, and an encapsulation layer are sequentially arranged in the display region along a direction away from the base substrate, and the thin film transistor comprises a buffer layer, an active layer, a gate insulating layer, a gate pattern, an interlayer dielectric layer, a source-drain pattern, and a flattened layer that are sequentially arranged along a direction away from the base substrate;
the isolation dams are arranged in a same layer as at least one inorganic film layer of the thin film transistor, the inorganic film layer of the thin film transistor comprises the buffer layer, the gate insulating layer, and the interlayer dielectric layer; and
the organic layer is arranged in a same layer as the flattened layer.

16. The display substrate according to claim 15, wherein the source-drain pattern comprises a source, a drain, and a signal trace, the gate pattern comprises a gate, the thin film transistor further comprises a target insulating layer and a capacitor plate located between the gate and the interlayer dielectric layer, and an orthographic projection of the capacitor plate onto the base substrate overlaps with an orthographic projection of the gate onto the base substrate;
the source and the drain are respectively connected with the active layer through via holes in the interlayer dielectric layer, the target insulating layer, and the gate insulating layer; and
the signal trace comprises a first signal line and a second signal line insulated from each other, the first signal line is connected with the capacitor plate through a via hole in the interlayer dielectric layer, and the second signal line is connected with the gate through via holes in the interlayer dielectric layer and the target insulating layer.

17. The display substrate according to claim 16, wherein the light emitting device comprises an anode, a pixel defining layer, a light emitting layer, and a cathode that are sequentially arranged on a side, distal from the base substrate, of the thin film transistor; and
the anode is connected with one of the source and the drain through a via hole in the flattened layer.

18. The display substrate according to claim 15, wherein the gate insulating layer comprises a first sub-gate insulating layer and a second sub-gate insulating layer that are arranged in a stacked manner, and the isolation dam comprises a first inorganic layer, a second inorganic layer, a third inorganic layer, and a fourth inorganic layer that are sequentially stacked along a direction away from the base substrate; and
the first inorganic layer is arranged in a same layer as the buffer layer, the second inorganic layer is arranged in a same layer as the first sub-gate insulating layer, the third inorganic layer is arranged in a same layer as the second sub-gate insulating layer, and the fourth inorganic layer is arranged in a same layer as the interlayer dielectric layer.

19. A display device, comprising the display substrate according to claim 1.

* * * * *